(12) United States Patent
Hoel et al.

(10) Patent No.: US 12,315,586 B2
(45) Date of Patent: May 27, 2025

(54) SRAM REPAIR SYSTEM AND METHOD

(71) Applicant: TEXAS INSTRUMENTS INCORPORATED, Dallas, TX (US)

(72) Inventors: Robin O. Hoel, Olso (NO); Praveen Kumar Narayanan, Bangalore (IN); Ruchi Shankar, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 63 days.

(21) Appl. No.: 17/823,599

(22) Filed: Aug. 31, 2022

(65) Prior Publication Data
US 2024/0071561 A1 Feb. 29, 2024

(30) Foreign Application Priority Data
Apr. 6, 2022 (IN) ............................. 202241020678

(51) Int. Cl.
*G11C 17/18* (2006.01)
*G11C 11/418* (2006.01)
*G11C 29/00* (2006.01)

(52) U.S. Cl.
CPC .......... *G11C 29/883* (2013.01); *G11C 11/418* (2013.01)

(58) Field of Classification Search
CPC .............................. G11C 29/883; G11C 11/418
See application file for complete search history.

(56) References Cited

U.S. PATENT DOCUMENTS

| | | | | |
|---|---|---|---|---|
| 2005/0132255 A1* | 6/2005 | Tran | ..................... | G11C 29/802 714/42 |
| 2008/0065929 A1* | 3/2008 | Nadeau-Dostie | .... | G11C 29/802 714/E11.054 |
| 2011/0280091 A1* | 11/2011 | Rooney | ................ | G11C 29/785 365/201 |
| 2015/0095732 A1* | 4/2015 | Aiken | ................ | G11C 29/4401 714/733 |

* cited by examiner

*Primary Examiner* — Min Huang
(74) *Attorney, Agent, or Firm* — Xianghui Huang; Frank D. Cimino

(57) ABSTRACT

An electronic system includes a repair MMR coupled with a first SRAM module within a plurality of SRAM modules coupled with each other in a daisy-chain configuration on a repair interface, and coupled with a last SRAM module within the plurality of SRAM modules via the repair interface. The electronic system also includes storage memory configured to store repair data for the plurality of SRAM modules and repair instructions, and processing circuitry. The processing circuitry is configured to, during boot up of the electronic system, read repair data for one or more of the plurality of SRAM modules from the storage memory, create serialized repair data for one or more the plurality of SRAM modules based on the repair instructions and the repair data, and to sequentially transmit the serialized repair data to the MMR.

20 Claims, 9 Drawing Sheets

SRAM REPAIR SYSTEM AND METHOD

BACKGROUND

Many electronic systems, such as microcontroller units, contain one or more static random-access memory (SRAM) modules for data storage during operation of the system. Since SRAM modules include very densely packed arrays of SRAM memory cells, production defects within the arrays often limit fabrication yield. With systems including multiple SRAM modules, and with production defects commonly occurring within the SRAM arrays, redundant cells are often added to the SRAM arrays to replace cells that are inoperable due to production defects.

In order to increase device reliability and production yield, redundant cells (rows or columns of cells) are incorporated into the SRAM memory array, and these redundant cells are used to replace faulty cells. During production testing, faulty cells are identified for each SRAM module and this information is recorded for later use in configuring each SRAM module to use redundant cells in place of the faulty cells as needed.

Some embodiments of SRAM modules use hardware fuses during production test to configure the SRAM module to use the redundant cells. Other embodiments store the defect information into non-volatile memory (such as flash memory) within the electronic system and this defect information is loaded into each SRAM module during boot of the electronic system. However, this is a complex and expensive solution to the problem of SRAM memory cell defects.

SUMMARY

In an implementation, an electronic system includes a repair memory-mapped register (MMR) coupled with a first SRAM module within a plurality of SRAM modules coupled with each other in a daisy-chain configuration on a repair interface, and coupled with a last SRAM module within the plurality of SRAM modules via the repair interface.

The electronic system also includes storage memory configured to store repair data for the plurality of SRAM modules and repair instructions, and processing circuitry. The processing circuitry is configured to, during boot up of the electronic system, read repair data for one or more of the plurality of SRAM modules from the storage memory, create serialized repair data for one or more the plurality of SRAM modules based on the repair instructions and the repair data, and sequentially transmit the serialized repair data to the MMR.

The MMR is configured to receive the sequentially transmitted serialized repair data from the processing circuitry, and to sequentially transmit the serialized repair data to the first SRAM module via the repair interface.

In another implementation, a method for repairing a plurality of static random-access memory (SRAM) modules coupled with each other in a daisy-chain configuration on a repair interface, during boot up of an electronic system, includes reading repair data and repair instructions for one or more of the plurality of SRAM modules from a storage memory, and creating serialized repair data for the one or more the plurality of SRAM modules based on the repair instructions and the repair data.

The method also includes sequentially transmitting the serialized repair data to a memory-mapped register (MMR), and sequentially transmitting the serialized repair data from the MMR to a first SRAM module within the plurality of SRAM modules via the repair interface.

In a further implementation, a plurality of static random-access memory (SRAM) modules coupled with each other in a daisy-chain configuration on a repair interface is provided. Each SRAM module includes a SRAM cell module, comprising a plurality of SRAM cell partitions and a plurality of redundant SRAM cell partitions, and a plurality of row decoders each corresponding to a row in the SRAM cell module, configured to select one of a plurality of rows within the SRAM cell module.

Each SRAM module also includes a plurality of column decoders each corresponding to a column in the SRAM cell module, configured to select one or more of a plurality of columns within the SRAM cell module, and a control module coupled with the SRAM cell module, the row decoders, and the column decoders.

The control module is configured to receive a serialized repair data input signal from the repair interface, and to process the serialized repair data input signal to determine if any of the plurality of SRAM cell partitions require replacement, and to identify SRAM cell partitions requiring replacement.

The control module is also configured to transmit a serialized repair data output signal to the repair interface based on the serialized repair data input signal, and to during operation of the SRAM, if any of the SRAM cell partitions require replacement, direct the row decoders and column decoders to utilize one or more of the redundant SRAM cell partitions in place of the SRAM cell partitions requiring replacement.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

The following descriptions of various example embodiments and implementations of an electronic system illustrate systems and methods for providing repair data to a plurality of SRAM modules using minimal hardware and maximal flexibility in response to configuration changes. In these various examples a memory-mapped register (MMR) is controlled by processing circuitry to provide repair instructions and/or data to a plurality of SRAM modules configured in daisy-chain fashion on a repair interface during boot up.

Repair instructions and data are stored in storage memory coupled with the processing circuitry and the MMR over a system bus. This provides a technical effect and technical advantage over other similar systems by providing the repair data to the SRAM modules over a simple repair interface, and since the repair instructions are stored in a memory, they are easy to modify as required when the quantity or configuration of the SRAM modules changes. In other words, changes to the SRAM modules only require changes to boot-up software for a microcontroller, and no hardware changes to the system. This flexibility in configuration of the electronic system provides a significant technical advantage over similar systems.

Figure 1:
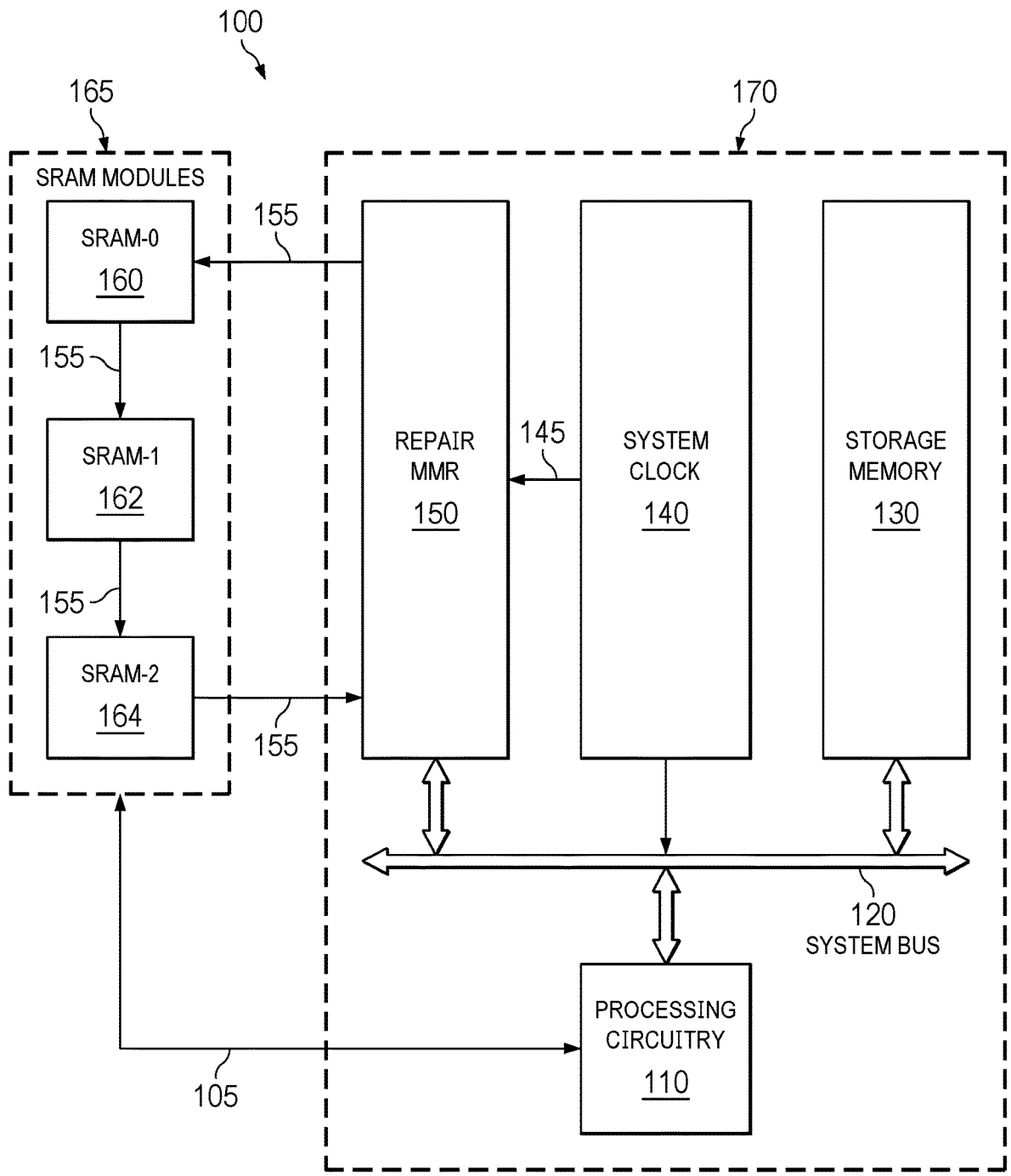
FIG. 1 illustrates a block diagram of an example embodiment of an electronic system including software-controlled SRAM repair.

FIG. 1 illustrates a block diagram of an example embodiment of an electronic system 100 including software-controlled SRAM repair. In this example embodiment, electronic system 100 includes microcontroller unit 170 and SRAM modules 165 configured to communicate with each other over memory bus 105. Microcontroller unit 170 includes processing circuitry 110, storage memory 130, system clock 140, repair memory-mapped register (MMR) 150. SRAM modules 165 includes three SRAM modules 160, 162, and 164. Processing circuitry 110 is coupled with storage memory 130 and repair MMR 150 over system bus 120. System clock 140 is provided to repair MMR 150 over link 145. Repair MMR 150 is coupled with SRAM modules SRAM-0 160, SRAM-1 162, and SRAM-2 164 via repair interface 155. SRAM modules 160, 162, and 164 are connected to repair interface 155 in a daisy-chain configuration. This enables the repair data transmitted on the repair interface 155 by MMR 150 to be read by all of the SRAM modules 160, 162, and 164 and then returned to MMR 150 to verify the integrity of the daisy-chain repair interface 155. In this example, SRAM-0 160 is the first SRAM in the daisy-chain and receives its repair data input from MMR 150, while SRAM-2 164 is the last SRAM in the daisy chain and transmits its repair data output to MMR 150.

While this simplified embodiment includes three SRAM modules, other embodiments include any number of SRAM modules, all within the scope of the present invention. In this example, storage memory 130 includes non-volatile memory that is configured to store repair data for SRAM modules 160, 162, and 164. During boot up of electronic system 100, this repair data and software instructions stored in storage memory 130 are provided to processing circuitry 110. In an example embodiment, software repair instructions also direct processing circuitry 110 to verify the integrity of the repair data within the non-volatile memory before loading the repair chain.

Processing circuitry 110 uses this repair data and software repair instructions to sequentially write to MMR 150 which in turn drives repair interface 155 in order to supply the repair data to each of the SRAM modules 160, 162, and 164. System clock 140 via link 145 is used to control the latching of data from processing circuitry 110 within repair MMR 150.

In this example embodiment, repair interface 155 includes four signals: a repair clock, a serial input, a serial output, and a clear signal. Three of these four signals are generated from a register within MMR 150 and illustrated in FIG. 2. The repair clock is the clock provided to SRAM modules 160, 162, and 164 on which repair data is latched. The serial input is the input to the repair chain, and the serial output is the serial return from the chain. The clear is a signal (in this example embodiment, an active low signal) to clear the repair data.

The repair clock, serial input, and clear signal are driven by three individual flip-flops which are arranged as fields within MMR 150. The serial output signal is implemented as a bit of MMR 150 that is written by the serial output of the last SRAM module of the daisy-chain and can be read by processing circuitry 110 to verify the continuity of repair interface 155.

By repeatedly writing MMR 150 with values representing a clock bit, an input bit, and a clear bit, processing circuitry 110 produces repair data on repair interface 155 in a protocol expected by SRAM modules 160, 162, and 164. This method of generating a clock and serial data is sometimes referred to as bit-banging. Bit-banging refers to any method of data transmission that employs software as a substitute for dedicated hardware to generate transmitted signals. Processing circuitry 110 is also configured to read the output bit from MMR 150 to verify proper functionality of MMR 150 and the integrity of repair interface 155. In an embodiment, the quantity of SRAM modules is stored in storage memory 130 and provided to processing circuitry 110 to configure the repair data and to determine an expected chain length of the repair data. Also, processing circuitry 110 is capable of modifying the frequency of the repair clock by managing when it transmits data to repair MMR 150.

Since the repair data and repair instructions are stored in storage memory 130, when configuration changes are made to electrical system 100, such as additional SRAM modules, no change is required to any of the hardware of electrical system 100. Processing circuitry 110, system clock 140, and repair MMR 150 remain unchanged while new repair data and instructions are placed in storage memory 130, directing processing circuitry 110 in such a manner as to incorporate the configuration changes. Thus, in some examples, only software needs to be modified to accommodate configuration changes to the SRAM modules.

Figure 2:
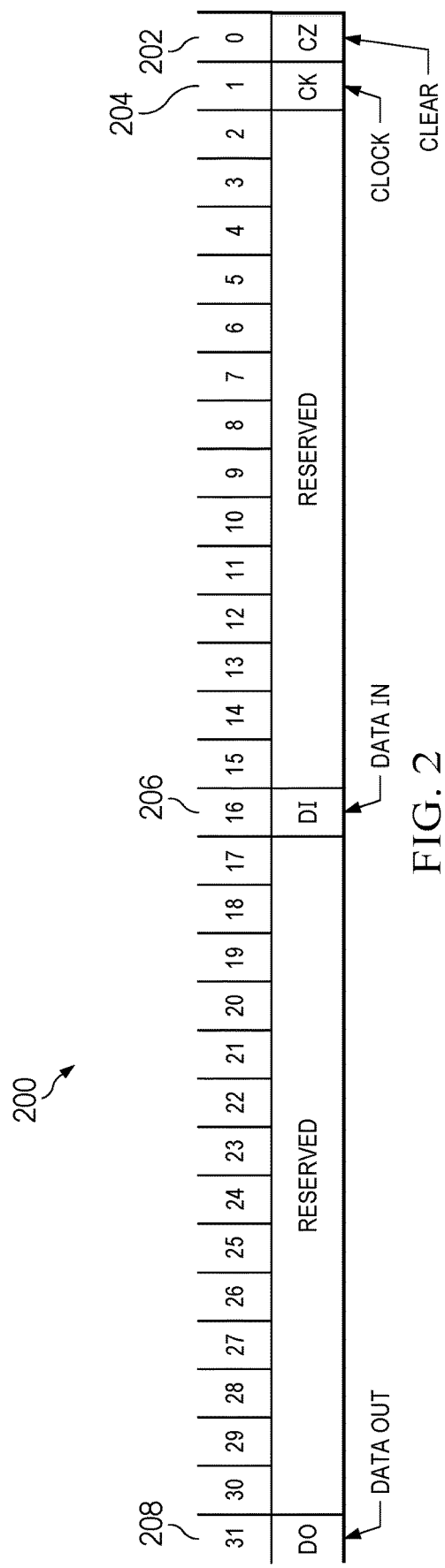
FIG. 2 illustrates a memory-mapped register configured to control a repair interface.

FIG. 2 illustrates a memory-mapped register 200 configured to control a repair interface 155. In this example embodiment, four bits of a 32-bit memory-mapped register 200 are used to control repair interface 155. Bit 0 202 of MMR 200 is used to provide the clear signal to repair interface 155. Bit 1 204 of MMR 200 is used to provide the clock signal to repair interface 155. Bit 16 206 of MMR 200 is used to provide the data input signal to repair interface 155. Bit 31 208 of MMR 200 is used to provide the data output signal to processing circuitry 110.

While this example embodiment provides a four-signal repair interface 155 implemented with a 32-bit MMR 200, other embodiments may use other repair interface protocols and other MMR configurations to produce the repair interface signals, all within the scope of the present invention.

Figure 3:
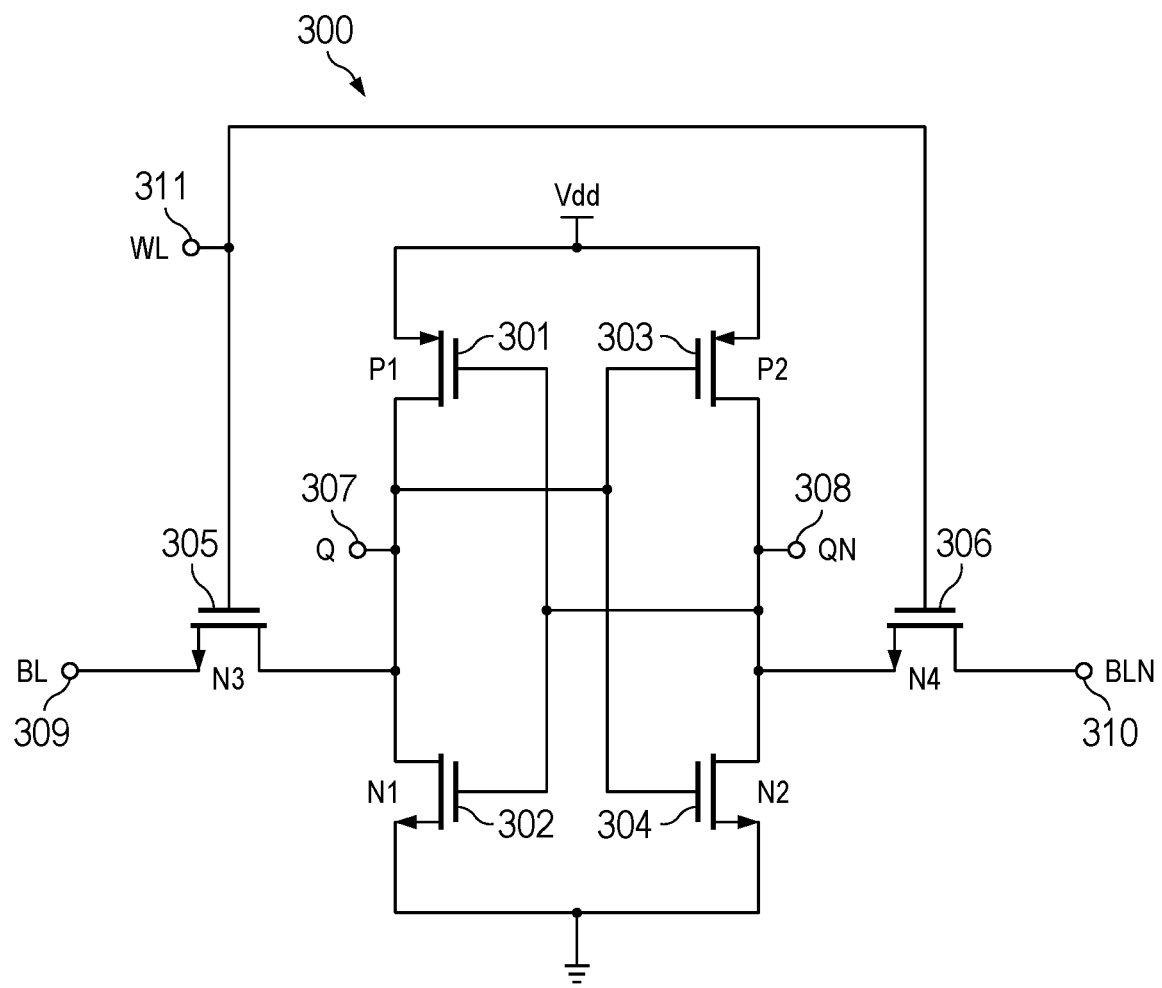
FIG. 3 illustrates an example embodiment of a static random-access memory cell.

FIG. 3 illustrates an example six-transistor SRAM cell 300 as used within various embodiments of the present invention. A variety of other SRAM cell designs are used in other embodiments, all within the scope of the present invention. This SRAM cell 300 comprises two cross-coupled complementary metal-oxide-semiconductor (CMOS) inverters for storing data. These two cross-coupled CMOS inverters are composed of transistors P1 301 and N1 302 forming a first CMOS inverter, and transistors P2 303 and N2 304 forming a second CMOS inverter. They are powered by power supply Vdd and include a connection to ground.

Together these cross-coupled inverters store data Q 307 and QN 308 (QN 308 is the inverse of Q 307). Reading and writing the data Q 307 and QN 308 is accomplished through a pair of n-type metal-oxide-semiconductor (NMOS) transfer gates N3 305 and N4 306. Other embodiments use other designs, such as full complementary transfer gates, all within the scope of the present invention. These transfer gates are controlled by word line WL 311. When WL 311 is high, the NMOS transfer gates are activated and data within the SRAM cell may be read or written on bit lines BL 309 and BLN 310. BL 309 is coupled with data Q 307 through NMOS transfer gate N3 305, while BLN 310 is coupled with data QN 308 through NMOS transfer gate N4 306.

BL 309 and BLN 310 act as inputs during write operations and as outputs during read operations. During a read operation, word line WL 311 is activated and bit lines BL 309 and BLN 310 are pre-charged. While the two NMOS transfer gates N3 305 and N4 306 are active, Q 307 is coupled with BL 309 and QN 308 is coupled with BLN 310. This results in voltage changes on BL 309 and BLN 310 which are detected by sense amplifiers (illustrated in FIG. 4) to determine the value of Q 307 within SRAM cell 300.

During a write operation, new data values for Q 307 and QN 308 are applied to BL 309 and BLN 310 respectively. Word line WL 311 is then activated, which causes NMOS transmission gates N3 305 and N4 306 to couple BL 309 to Q 307 and BLN 310 to QN 308. The voltages on BL 309 and BLN 310 overwrite the previous data stored on Q 307 and QN 308, thus storing the new data value within SRAM cell 300 once WL 311 is deactivated, shutting off the NMOS transmission gates N3 305 and N4 306 and isolating Q 307 from BL 309 and QN 308 from BLN 310.

Figure 4:
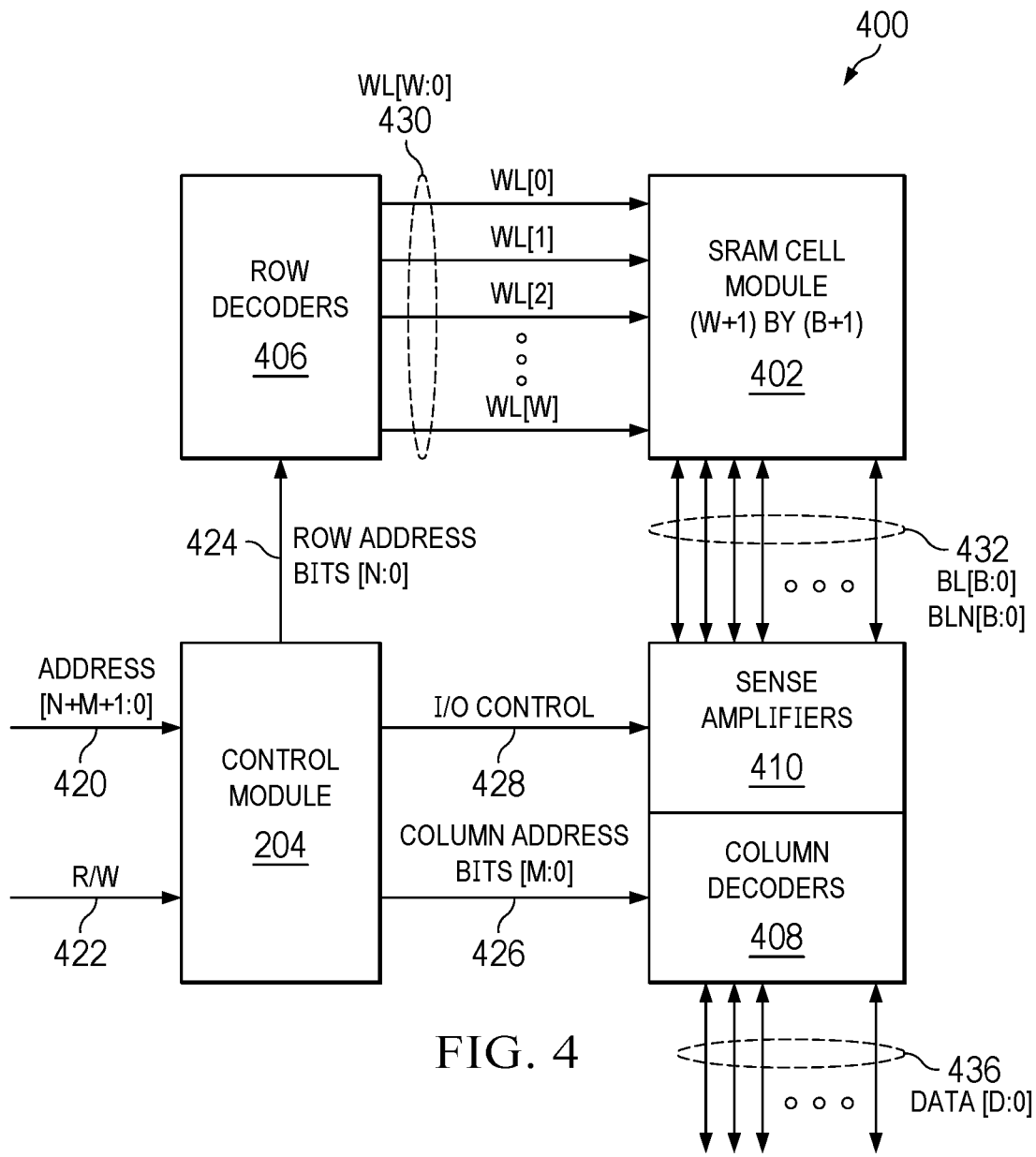
FIG. 4 illustrates a block diagram of an example embodiment of a static random-access memory.

FIG. 4 illustrates a block diagram of an example embodiment of a static random-access memory 400. In this simplified block diagram of a SRAM 400, such as used within various embodiments of the present invention, a SRAM cell module 402 comprises an array of SRAM cells such as the six-transistor cell 300 illustrated in FIG. 3.

In this example embodiment, SRAM cell module 402 comprises an array of (W+1) by (B+1) SRAM cells 300. W+1 is the number of word lines and B+1 is the number of bit lines within the array 402. Word lines WL[W:0] 430 are provided to SRAM cell module 402 by a plurality of row decoders 406, while bit lines BL[B:0] and BLN[B:0] 432 are provided to SRAM cell module 402 by a plurality of column decoders 408.

A plurality of sense amplifiers 410 are provided to read data appearing on bit lines BL[B:0] and BLN[B:0] 432 during read operations, as discussed above with respect to FIG. 3. Data[D:0] 436 is provided at the outputs of sense amplifiers 410 during read operations, and provided to bit lines BL[B:0] and BLN[B:0] 432 through column decoders 408 during write operations.

Row decoders 406, column decoders 408 and sense amplifiers 410 are controlled by control module 404. In this example embodiment, control module 404 receives address bits Address[N+M+1:0] 420 and read/write control signal 422, and divides address bits Address[N+M+1:0] 420 into Row Address Bits[N:0] 424 and Column Address Bits[M:0] 426 which are provided to row decoders 406 and column decoders 408 respectively. Control module 404 also provides I/O control 428 to sense amplifiers 410.

Figure 5:
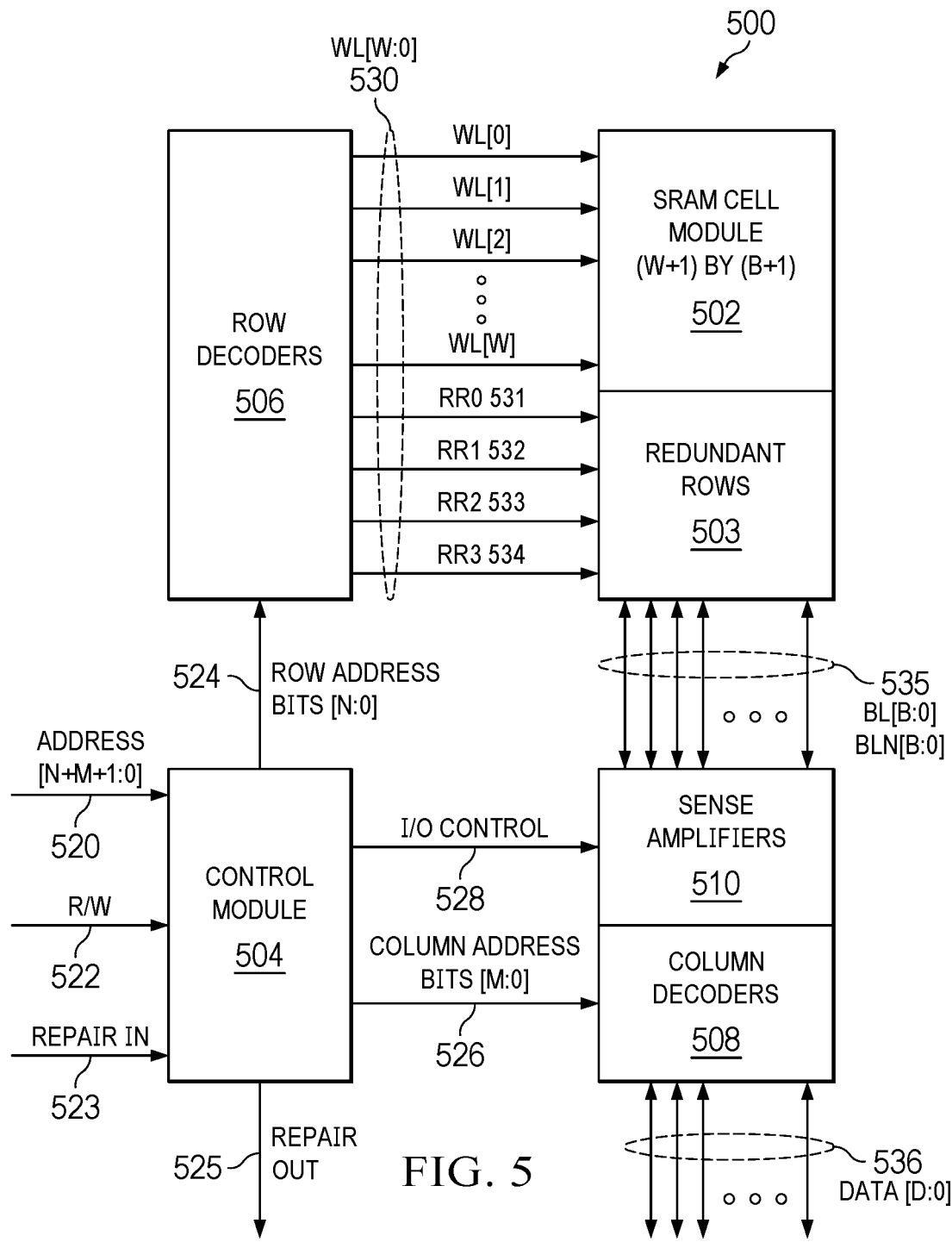
FIG. 5 illustrates a block diagram of an example embodiment of a static random-access memory including redundance and repair capability.

FIG. 5 illustrates a block diagram of an example embodiment of a static random-access memory 500 including redundancy and a repair capability. In this simplified block diagram, SRAM 500 includes SRAM cell module 502 (similar to SRAM cell module 402 from FIG. 4), and control module 504 (similar to control module 404 from FIG. 4). In this example embodiment, SRAM cell module 502 includes a plurality of redundant cells illustrated as redundant rows 503.

In this example embodiment, SRAM cell module 502 comprises an array of (W+1) by (B+1) SRAM cells 300, along with four redundant rows 503 of SRAM cells 300. W+1 is the number of word lines and B+1 is the number of bit lines within the array 502. Word lines WL[W:0] 530 are provided to SRAM cell module 502 by a plurality of row decoders 506, while bit lines BL[B:0] and BLN[B:0] 532 are provided to SRAM cell module 502 by a plurality of column decoders 508.

A plurality of sense amplifiers 510 are provided to read data appearing on bit lines BL[B:0] and BLN[B:0] 532 during read operations, as discussed above with respect to FIG. 3. Data[D:0] 536 is provided at the outputs of sense amplifiers 510 during read operations, and provided to bit lines BL[B:0] and BLN[B:0] 532 through column decoders 508 during write operations.

Row decoders 506, column decoders 508 and sense amplifiers 510 are controlled by control module 504. In this example embodiment, control module 504 receives address bits Address[N+M+1:0] 520 and read/write control signal 522, and divides address bits Address[N+M+1:0] 520 into Row Address Bits[N+1:0] 524 and Column Address Bits [M:0] 526 which are provided to row decoders 506 and column decoders 508 respectively. Control module 504 also provides I/O control 528 to sense amplifiers 510.

While this example embodiment, includes redundant rows 503, other embodiments may include redundant columns of SRAM cells, or still other configurations of redundant SRAM cells for use in replacing portions of SRAM cell module 502 containing faulty cells.

In example embodiments, SRAM cell module 502 comprises a plurality of SRAM rows 530 controlled by write lines WL[W:0], and also includes redundant rows RR0 531, RR2 532, RR3, 533, and RR4 534. Other embodiments provide various sizes of SRAM cell modules with various numbers of rows and redundant rows (or other redundant blocks), all within the scope of the present invention. In order to provide redundant rows where necessary, additional row decoders 506 are provided within SRAM module 500, and control module 504 provides row decoders 506 with an additional address bit with Row Address Bits[N+1:0] 524 as compared to the example illustrated in FIG. 4.

In an example embodiment, control module 504 includes circuitry providing SRAM 500 the capability to replace faulty rows within SRAM cell module 502 with one or more of the redundant rows 503. This capability is provided by control module 504 as instructed by a repair interface which includes repair in bus 523 and repair out bus 525. Data received over the repair interface is stored within control module 504 and used by control module 504 to operate SRAM 500 while substituting redundant rows 503 for rows flagged as having faults by the repair data. Control module 504 is illustrated in further detail in FIG. 6.

In an example embodiment, control module 504 stores in memory repair data specifying which rows are defective and which redundant rows 503 are to be used in place of the defective rows. When control module 504 receives an address 520 directed to one of the defective rows, it substitutes the row address for the appropriate redundant row from the repair data stored in the memory and provides this redundant row address to row decoders 506 in place of the address directed to a defective row.

Since the plurality of SRAM modules 160, 162, and 164 within electronic system 100 are connected together in a daisy-chain configuration on repair interface 155, control module 504 is configured to sequentially store the incoming serial repair data in a memory, then pass on the received repair data to the next SRAM module in the chain. This operation is further illustrated in FIG. 7.

In an example embodiment, the operation of control module 504 is performed in a series of steps. First control module 504 receives a serialized repair data input signal from the repair interface 523. Control module 504 processes the serialized repair data input signal to determine if any of the plurality of SRAM cell partitions require replacement, and to identify SRAM cell partitions requiring replacement. Control module 504 also transmits a serialized repair data output signal to the repair interface based on the serialized repair data input signal.

Later, during operation of the SRAM 500, if any of the SRAM cell partitions (in this example, rows) require replacement, control module 504 directs the row decoders and column decoders to utilize one or more of the redundant SRAM cell partitions 503 in place of the SRAM cell partitions requiring replacement.

Figure 6:
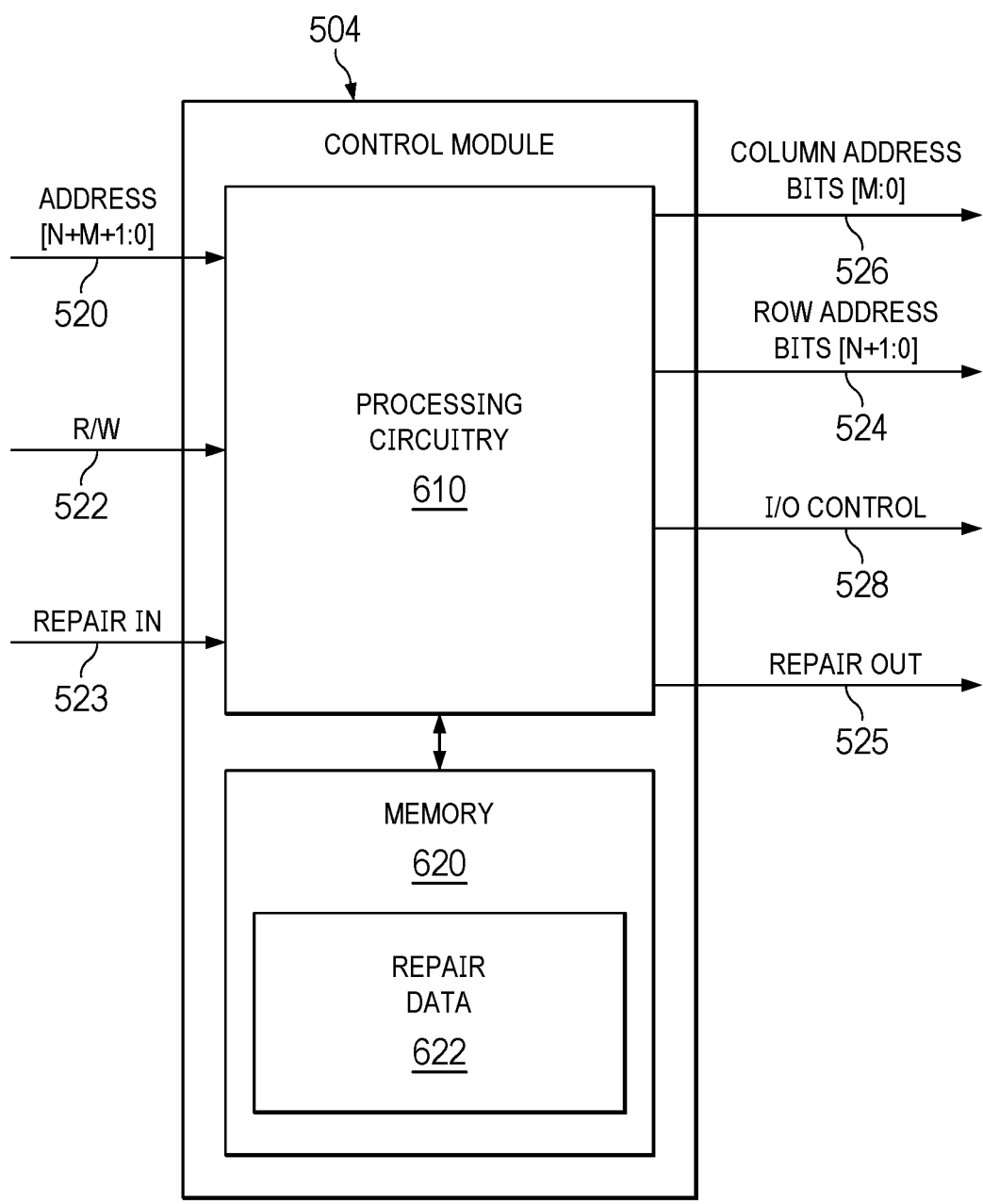
FIG. 6 illustrates a block diagram of an example embodiment of a control module within a static random-access memory including redundance and repair capability.

FIG. 6 illustrates a block diagram of an example embodiment of a control module 504 within a static random-access memory 500 including redundance and repair capability. This example embodiment of control module 504 includes processing circuitry 610, and memory 620. Memory 620 includes repair data portion 622.

In this example embodiment, control module 504 receives address bits Address[N+M+1:0] 520 and read/write control signal 522, and divides address bits Address[N+M+1:0] 520 into Row Address Bits[N+1:0] 524 and Column Address Bits[M:0] 526 which are provided to row decoders 506 and column decoders 508 respectively. Control module 504 also provides I/O control 528 to sense amplifiers 510.

Repair data portion 622 is configured to store repair data for SRAM 500 received over repair interface 155 via the repair in bus 523. In an example embodiment, repair data 622 comprises a mapping between addresses of defective rows and addresses of redundant rows that are used to replace the defective rows. Control module 504 also provides repair out bus 525 to the next SRAM in the daisy-chain repair interface.

Figure 7:
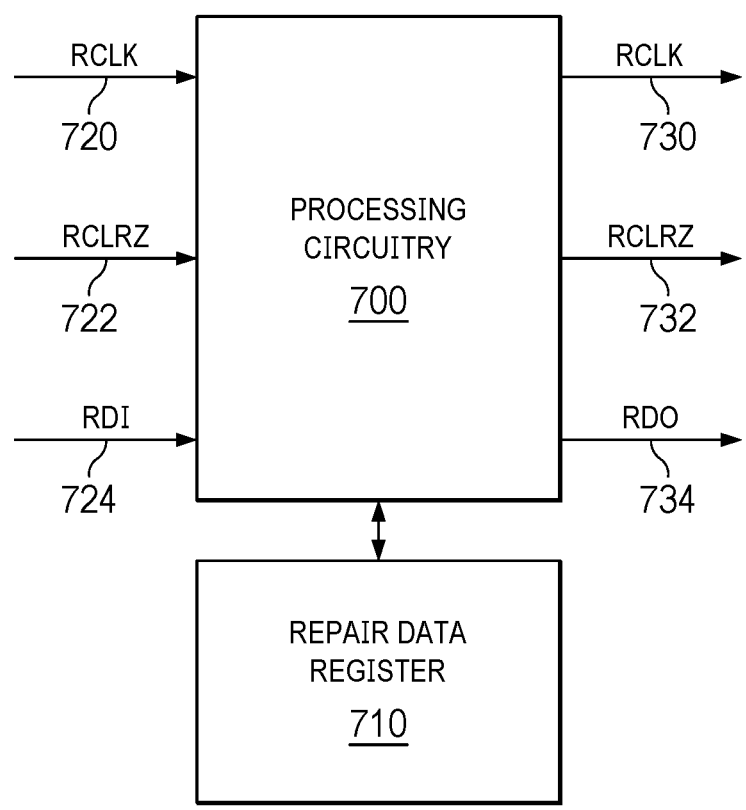
FIG. 7 illustrates a block diagram of an example embodiment of a portion of a control module within a static random-access memory operating a repair interface.

FIG. 7 illustrates a block diagram of an example embodiment of a portion of a control module 504 within a static random-access memory 500 operating a repair interface. Here, a portion of control module 504 configured to operate repair interface 155 is illustrated. In this example, repair in bus 523 from FIG. 5 is broken out into its individual signals RCLK 720, RCLRZ 722, and RDI 724. Repair out bus 525 from FIG. 5 is broken out into its individual signals RCLK 730, RCLRZ 732, and RDO 734.

This portion of control module 504 includes processing circuitry 700 which receives the signals from repair in bus 523 and transmits the signals to repair out bus 525, along with repair data register 710 which is used to store repair data received over repair in bus 523.

In this example embodiment, RCLK 720 and 730 are the repair clock on which the repair data is latched into repair data register 710. RCLRZ 722 and 732 are the active clear signal for the repair data. RDI 724 is the serialized repair data input which is latched into repair data register 710. RDO 734 is the serialized repair data output which is the repair data input to be sent to the next SRAM in the daisy-chain where it will become the repair data input for that SRAM (or latched into MMR 150 if this is the last SRAM in the daisy chain).

Figure 8:
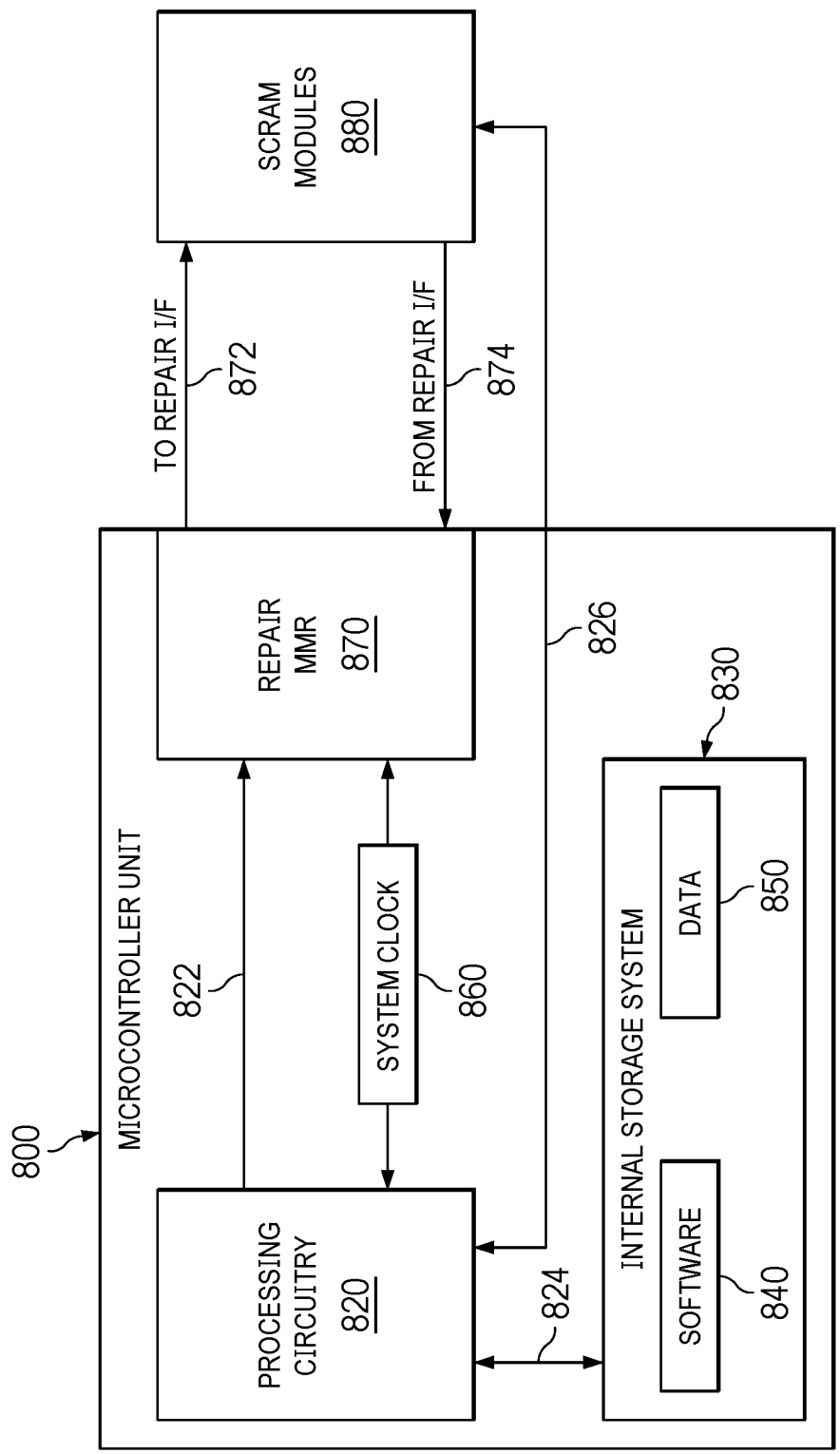
FIG. 8 illustrates a block diagram of an example embodiment of a microcontroller unit configured to provide repair data to one or more SRAM modules.

FIG. 8 illustrates a block diagram of an example embodiment of a microcontroller unit 800 configured to provide repair data to one or more SRAM modules 880. As discussed above, microcontroller unit 800 may take on any of a wide variety of configurations. Here, a simplified example configuration is provided for a microcontroller unit 170 as illustrated in FIG. 1 and described above.

In this example embodiment, microcontroller unit 800 comprises processing circuitry 820, system clock 860, repair MMR 870, and internal storage system 830. Repair MMR 870 communicates with external SRAM modules 880 over repair interface 872 and 874. System clock 860 provides a clock signal to processing circuitry 820 and repair MMR 870. Processing circuitry 820 is also configured to provide repair data and instructions to repair MMR 870 over bus 822. Repair MMR 870 is a memory mapped register configured to send repair information to a first SRAM module of the plurality of SRAM modules 880 over repair interface 872 and to receive a return signal from a last SRAM module of the plurality of SRAM modules 880 over repair interface 874. Processing circuitry 820 communicates with SRAM modules 880 over memory bus 826.

Processing circuitry 820 comprises electronic circuitry configured to direct microcontroller unit 800 to provide repair instruction to SRAM modules 880 over repair interface 872 and 874 as described above. Processing circuitry 820 may comprise microprocessors and other circuitry that retrieves and executes software 840. Examples of processing circuitry 820 include general purpose central processing units, application specific processors, and logic devices, as well as any other type of processing device, combinations, or variations thereof. Processing circuitry 820 can be implemented within a single processing device but can also be distributed across multiple processing devices or sub-systems that cooperate in executing program instructions.

Internal storage system 830 can comprise any non-transitory computer readable storage media capable of storing software 840 that is executable by processing circuitry 820. Internal storage system 830 can also include various data structures 850 which comprise one or more registers, databases, tables, lists, or other data structures. Storage system 830 can include volatile and nonvolatile, removable and non-removable media implemented in any method or technology for storage of information, such as computer readable instructions, data structures, program modules, or other data. In this example embodiment, internal storage system 830 includes flash memory within microcontroller unit 800 which also stores repair data for SRAM modules 880.

Storage system 830 can be implemented as a single storage device but can also be implemented across multiple storage devices or sub-systems co-located or distributed relative to each other. Storage system 830 can comprise additional elements, such as a controller, capable of communicating with processing circuitry 820. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which can be used to store the desired information and that can be accessed by an instruction execution system, as well as any combination or variation thereof.

Software 840 can be implemented in program instructions and among other functions can, when executed by microcontroller unit 800 in general or processing circuitry 820 in particular, direct microcontroller unit 800, or processing circuitry 820, to operate as described herein to provide SRAM repair instructions and data to SRAM modules 880. Software 840 can include additional processes, programs, or components, such as operating system software, database software, or application software. Software 840 can also comprise firmware or some other form of machine-readable processing instructions executable by elements of processing circuitry 820.

In at least one example implementation, the program instructions include various modules configured to direct processing circuitry 820 to repair MMR 870 to produce repair data for transfer to SRAM modules 880 over repair interface 872 and 874 as described above.

In general, software 840 can, when loaded into processing circuitry 820 and executed, transform processing circuitry 820 overall from a general-purpose computing system into a special-purpose computing system customized to operate as described herein for a microcontroller unit 800 configured to provide repair data to SRAM modules 880, among other operations. Encoding software 840 on internal storage system 830 can transform the physical structure of internal storage system 830. The specific transformation of the physical structure can depend on various factors in different implementations of this description. Examples of such factors can include, but are not limited to the technology used to implement the storage media of internal storage system 830 and whether the computer-storage media are characterized as primary or secondary storage.

For example, if the computer-storage media are implemented as semiconductor-based memory, software 840 can transform the physical state of the semiconductor memory when the program is encoded therein. For example, software 840 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

Figure 9:
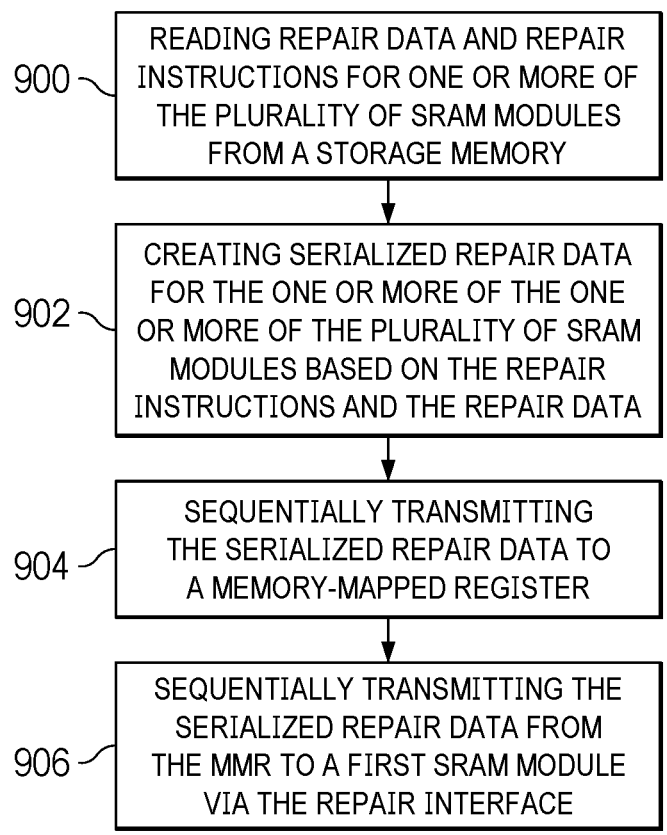
FIG. 9 illustrates a flow chart of an example embodiment of a method for repairing a plurality of static random-access memory (SRAM) modules coupled with each other in a daisy-chain configuration on a repair interface, during boot up of an electronic system.

FIG. 9 illustrates a flow chart of an example embodiment of a method for repairing a plurality of static random-access memory (SRAM) modules 160, 162, and 164 coupled with each other in a daisy-chain configuration on a repair interface 155, during boot up of an electronic system 100. In an example embodiment, during boot up of electronic system 100, processing circuitry 110 reads repair data and repair instructions for one or more of the plurality of SRAM modules 160, 162, and 164 from a storage memory 130, (operation 900).

Processing circuitry 110 creates serialized repair data for the one or more the plurality of SRAM modules 160, 162, and 164 based on the repair instructions and the repair data from storage memory 130, (operation 902).

Processing circuitry 110 sequentially transmits the serialized repair data to memory-mapped register (MMR) 150, (operation 904). MMR 150 sequentially transmits the serialized repair data to a first SRAM module 160 within the plurality of SRAM modules 160, 162, and 164 via the repair interface 155, (operation 906).

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

What is claimed is:

1. An electronic system comprising:
   a repair memory-mapped register (MMR) coupled with a first SRAM module within a plurality of SRAM modules coupled with each other in a daisy-chain configuration on a repair interface, and coupled with a last SRAM module within the plurality of SRAM modules via the repair interface;
   storage memory configured to store repair data for the plurality of SRAM modules and repair instructions; and
   processing circuitry, configured to, during boot up of the electronic system:
   read repair data for one or more of the plurality of SRAM modules from the storage memory;
   create serialized repair data for the one or more of the plurality of SRAM modules based on the repair instructions and the repair data; and
   sequentially transmit the serialized repair data to the MMR;
   wherein the MMR is configured to receive the sequentially transmitted serialized repair data from the processing circuitry, and to sequentially transmit the serialized repair data to the first SRAM module via the repair interface; and
   wherein the repair interface comprises a repair clock corresponding to a clock bit of the MMR, further wherein the processing circuitry is configured to sequentially transmit the serialized repair data by writing values representing the repair clock to the clock bit of the MMR.

2. The electronic system of claim 1, wherein the MMR is further configured to sequentially receive the serialized repair data from the last SRAM module via the repair interface and sequentially transmit the received serialized repair data to the processing circuitry.

3. The electronic system of claim 2, wherein the processing circuitry is further configured to:
   receive the received serialized repair data from the MMR; and
   process the received serialized repair data from the MMR to determine a continuity of the repair interface within the plurality of SRAM modules.

4. The electronic system of claim 1, wherein the repair interface comprises a serial input corresponding to an input bit of the MMR, and wherein the processing circuitry is configured to sequentially transmit the serialized repair data by writing values representing data values of the serial input to the input bit of the MMR.

5. The electronic system of claim 1, wherein the storage memory comprises non-volatile random-access memory.

6. The electronic system of claim 1, wherein each SRAM module comprises:
   a SRAM cell module, comprising a plurality of SRAM cell partitions and a plurality of redundant SRAM cell partitions;
   a plurality of row decoders each corresponding to a row in the SRAM cell module, configured to select one of a plurality of rows within the SRAM cell module;

a plurality of column decoders each corresponding to a column in the SRAM cell module, configured to select one or more of a plurality of columns within the SRAM cell module; and a control module coupled with the SRAM cell module, the row decoders, and the column decoders, configured to:
receive a serialized repair data input signal from the repair interface, wherein the serialized repair data input signal comprises a serial input corresponding to an input bit of the MMR;
process the serialized repair data input signal to determine if any of the plurality of SRAM cell partitions require replacement, and to identify SRAM cell partitions requiring replacement;
transmit a serialized repair data output signal to the repair interface based on the serialized repair data input signal; and
during operation of the SRAM, if any of the SRAM cell partitions require replacement, direct the row decoders and column decoders to utilize one or more of the redundant SRAM cell partitions in place of the SRAM cell partitions requiring replacement.

7. The electronic system of claim 6, wherein each SRAM cell module comprises a plurality of redundant SRAM rows.

8. The electronic system of claim 6, wherein each SRAM cell module comprises a plurality of redundant SRAM columns.

9. The electronic system of claim 6, wherein the control module is configured to transmit the serialized repair data input signal as the serialized repair data output signal.

10. A method for repairing a plurality of static random-access memory (SRAM) modules coupled with each other in a daisy-chain configuration on a repair interface, during boot up of an electronic system, the method comprising:
reading repair data and repair instructions for one or more of the plurality of SRAM modules from a storage memory;
creating serialized repair data for the one or more the plurality of SRAM modules based on the repair instructions and the repair data;
sequentially transmitting the serialized repair data to a memory-mapped register (MMR); and
sequentially transmitting the serialized repair data from the MMR to a first SRAM module within the plurality of SRAM modules via the repair interface, wherein the repair interface comprises a repair clock corresponding to a clock bit of the MMR, further wherein sequentially transmitting the serialized repair data to the MMR includes writing values representing the repair clock to the clock bit of the MMR.

11. The method of claim 10, further comprising:
sequentially receiving the serialized repair data from a last SRAM module within the plurality of SRAM modules via the repair interface at the MMR; and
processing the received serialized repair data from the MMR to determine a continuity of the repair interface within the plurality of SRAM modules.

12. The method of claim 10, wherein the repair interface comprises a serial input corresponding to an input bit of the MMR and wherein sequentially transmitting the serialized repair data to the MMR includes writing values representing the serial input to the input bit of the MMR.

13. The method of claim 10, wherein the storage memory comprises non-volatile random-access memory.

14. The method of claim 10, wherein each SRAM module comprises:

a SRAM cell module, comprising a plurality of SRAM cell partitions and a plurality of redundant SRAM cell partitions;
a plurality of row decoders each corresponding to a row in the SRAM cell module, configured to select one of a plurality of rows within the SRAM cell module;
a plurality of column decoders each corresponding to a column in the SRAM cell module, configured to select one or more of a plurality of columns within the SRAM cell module; and
a control module coupled with the SRAM cell module, the row decoders, and the column decoders, configured to:
receive a serialized repair data input signal from the repair interface, wherein the serialized repair data input signal comprises a serial input corresponding to an input bit of the MMR;
process the serialized repair data input signal to determine if any of the plurality of SRAM cell partitions require replacement, and to identify SRAM cell partitions requiring replacement;
transmit a serialized repair data output signal to the repair interface based on the serialized repair data input signal; and
during operation of the SRAM, if any of the SRAM cell partitions require replacement, direct the row decoders and column decoders to utilize one or more of the redundant SRAM cell partitions in place of the SRAM cell partitions requiring replacement.

15. The method of claim 14, wherein each SRAM cell module comprises a plurality of redundant SRAM rows.

16. The method of claim 14, wherein each SRAM cell module comprises a plurality of redundant SRAM columns.

17. The method of claim 14, wherein the control module is configured to transmit the serialized repair data input signal as the serialized repair data output signal.

18. A plurality of static random-access memory (SRAM) modules coupled with each other in a daisy-chain configuration on a repair interface, each SRAM module comprising:
a SRAM cell module, comprising a plurality of SRAM cell partitions and a plurality of redundant SRAM cell partitions;
a plurality of row decoders each corresponding to a row in the SRAM cell module, configured to select one of a plurality of rows within the SRAM cell module;
a plurality of column decoders each corresponding to a column in the SRAM cell module, configured to select one or more of a plurality of columns within the SRAM cell module; and
a control module coupled with the SRAM cell module, the row decoders, and the column decoders, configured to:
receive a serialized repair data input signal from a memory mapped register (MMR) via the repair interface, wherein the repair interface comprises a repair clock corresponding to a clock bit of the MMR, further wherein the serialized repair data input signal is transmitted to the control module by values representing the repair clock being written to the clock bit of the MMR;
process the serialized repair data input signal to determine if any of the plurality of SRAM cell partitions require replacement, and to identify SRAM cell partitions requiring replacement;
transmit a repair data output signal to the repair interface based on the serialized repair data input signal; and
during operation of the SRAM, if any of the SRAM cell partitions require replacement, direct the row decoders and column decoders to utilize one or more of the redundant SRAM cell partitions in place of the SRAM cell partitions requiring replacement.

19. The electronic system of claim 1, wherein the repair interface further comprises a clear signal.

20. The method of claim 10, wherein the MMR further comprises bits corresponding to a clear signal.

* * * * *